(12) United States Patent
Guo

(10) Patent No.: US 8,785,950 B2
(45) Date of Patent: Jul. 22, 2014

(54) CHIP WITH SEMICONDUCTOR ELECTRICITY CONVERSION STRUCTURE

(71) Applicant: Lei Guo, Beijing (CN)

(72) Inventor: Lei Guo, Beijing (CN)

( * ) Notice: Subject to any disclaimer, the term of this patent is extended or adjusted under 35 U.S.C. 154(b) by 0 days.

(21) Appl. No.: 13/823,545

(22) PCT Filed: Nov. 9, 2012

(86) PCT No.: PCT/CN2012/084409
§ 371 (c)(1),
(2), (4) Date: Mar. 14, 2013

(87) PCT Pub. No.: WO2013/067966
PCT Pub. Date: May 16, 2013

(65) Prior Publication Data
US 2014/0054615 A1   Feb. 27, 2014

(30) Foreign Application Priority Data

| Nov. 10, 2011 | (CN) | 2011 1 0356005 |
| Jan. 20, 2012 | (CN) | 2012 1 0020018 |
| Apr. 24, 2012 | (CN) | 2012 1 0123075 |
| Sep. 5, 2012 | (CN) | 2012 1 0326608 |
| Sep. 5, 2012 | (CN) | 2012 1 0326663 |
| Oct. 17, 2012 | (CN) | 2012 1 0395009 |

(51) Int. Cl.
*H01L 33/00* (2010.01)
*H04B 10/00* (2013.01)

(52) U.S. Cl.
CPC ..................................... *H04B 10/00* (2013.01)
USPC .......................................................... 257/84

(58) Field of Classification Search
CPC ....................................................... H04B 10/00
USPC .......... 363/123; 398/185; 257/84, 431, 79–80
See application file for complete search history.

(56) References Cited

U.S. PATENT DOCUMENTS

| 3,790,867 A | 2/1974 | Hayakawa |
| 5,009,719 A | 4/1991 | Yoshida |

(Continued)

FOREIGN PATENT DOCUMENTS

| CN | 1993836 A | 7/2007 |
| CN | 101257055 A | 9/2008 |

(Continued)

OTHER PUBLICATIONS

International Search Report and Written Opinion dated Feb. 21, 2013 for corresponding International Application No. PCT/CN2012/084409, filed Nov. 9, 2012.

*Primary Examiner* — Nathan Ha
(74) *Attorney, Agent, or Firm* — David D. Brush; Westman, Champlin & Koehler, P.A.

(57) ABSTRACT

A semiconductor electricity conversion structure is provided. The semiconductor electricity conversion structure includes: a substrate; and at least one semiconductor electricity conversion structure formed on the substrate, the at least one semiconductor electricity conversion structure including: at least one semiconductor electricity-to-light conversion unit for converting an input electric energy into a light energy, and at least one semiconductor light-to-electricity conversion unit for converting the light energy back into an output electric energy, in which a number of the semiconductor electricity-to-light conversion unit is in proportion to a number of the semiconductor light-to-electricity conversion unit to realize an electricity conversion, and an emitting spectrum of the semiconductor electricity-to-light conversion unit and an absorption spectrum of the semiconductor light-to-electricity conversion unit are matched with each other.

32 Claims, 8 Drawing Sheets

(56) References Cited

U.S. PATENT DOCUMENTS

| | | | |
|---|---|---|---|
| 5,981,931 A * | 11/1999 | Kinno et al. | 250/208.1 |
| 6,278,055 B1 | 8/2001 | Forrest et al. | |
| 7,180,098 B2 | 2/2007 | Speyer et al. | |
| 7,964,925 B2 | 6/2011 | Fattal et al. | |
| 8,129,611 B2 | 3/2012 | Kobayashi et al. | |
| 8,208,818 B2 * | 6/2012 | Sasai | 398/185 |
| 2003/0025076 A1 * | 2/2003 | Takagi et al. | 250/311 |
| 2003/0122228 A1 * | 7/2003 | Nagase et al. | 257/678 |
| 2004/0246032 A1 * | 12/2004 | Ogiso et al. | 327/141 |
| 2008/0224132 A1 | 9/2008 | Forrest et al. | |
| 2009/0168410 A1 | 7/2009 | Tanamura et al. | |
| 2009/0206257 A1 * | 8/2009 | Gunji et al. | 250/310 |
| 2009/0208091 A1 * | 8/2009 | Hayakawa et al. | 382/149 |
| 2009/0208221 A1 * | 8/2009 | Sasai | 398/130 |
| 2010/0229912 A1 | 9/2010 | Eo et al. | |
| 2011/0108856 A1 | 5/2011 | Wu et al. | |
| 2011/0126889 A1 * | 6/2011 | Bourke, Jr. et al. | 136/253 |
| 2011/0174358 A1 | 7/2011 | Shin et al. | |
| 2011/0174366 A1 | 7/2011 | Frolov et al. | |
| 2011/0233701 A1 * | 9/2011 | Mitsui et al. | 257/431 |
| 2011/0315877 A1 * | 12/2011 | Isozaki et al. | 250/310 |
| 2012/0249864 A1 | 10/2012 | Robinson et al. | |
| 2013/0049927 A1 | 2/2013 | Ichimori | |
| 2013/0181208 A1 | 7/2013 | Lei Guo | |

FOREIGN PATENT DOCUMENTS

| | | |
|---|---|---|
| CN | 102005978 A | 4/2011 |
| CN | 201893715 U | 7/2011 |
| CN | 201893718 U | 7/2011 |
| CN | 102427094 A | 4/2012 |
| CN | 102496649 A | 6/2012 |
| CN | 102569488 A | 7/2012 |
| CN | 102569489 A | 7/2012 |
| CN | 202503017 U | 10/2012 |
| CN | 202523745 U | 11/2012 |
| CN | 102832288A A | 12/2012 |
| JP | H01311841 A | 12/1989 |
| JP | 2007294630 A | 11/2007 |

\* cited by examiner

CHIP WITH SEMICONDUCTOR ELECTRICITY CONVERSION STRUCTURE

CROSS-REFERENCE TO RELATED APPLICATIONS

This Application is a Section 371 National Stage Application of International Application No. PCT/CN2012/084409, filed Nov. 9, 2012, which is incorporated by reference in its entirety and has not yet been published.

This application claims priority to and benefits of the following applications:

1) Chinese Patent Application Serial No. 201110356005.4, filed with the State Intellectual Property Office of P. R. China on Nov. 10, 2011;

2) Chinese Patent Application Serial No. 201210326663.3, filed with the State Intellectual Property Office of P. R. China on Sep. 5, 2012;

3) Chinese Patent Application Serial No. 201210123075.X, filed with the State Intellectual Property Office of P. R. China on Apr. 24, 2012;

4) Chinese Patent Application Serial No. 201210326608.4, filed with the State Intellectual Property Office of P. R. China on Sep. 5, 2012;

5) Chinese Patent Application Serial No. 201210020018.9, filed with the State Intellectual Property Office of P. R. China on Jan. 20, 2012; and 6) Chinese Patent Application Serial No. 201210395009.8, filed with the State Intellectual Property Office of P. R. China on Oct. 17, 2012.

The entire contents of the above applications are incorporated herein by reference.

FIELD

The present disclosure relates to a semiconductor field, and more particularly to a chip with a semiconductor electricity conversion structure.

BACKGROUND

With a development of a semiconductor technology, a device number on an IC (integrated circuit) chip is larger and larger. Various circuit modules and function modules, such as a radio-frequency circuit, an analog circuit, a digital circuit, a MEMS (Micro Electronic Mechanical System) device, or a flash memory circuit, which are integrated on one chip, require different supply voltages. For instance, about 1V is required for the digital circuit, a high writing voltage of tens of volts is required for the flash memory, a supply voltage of dozens of volts (even hundreds of volts) may be required for some sensor devices. Moreover, different circuit modules with a same supply voltage even may interact with each other via a power supply line, thus inducing a noise or a distortion, etc. In addition, a feature size of a device is smaller and smaller, the supply voltage is lower and lower, and accordingly a power consumption is continuously increased, thus causing a sharp increase of a working current of the power supply, and a greater resistance loss resulted from a larger and larger influence of a series resistance of interconnections on the chip. Therefore, the on-chip power supply system are required to have higher performances.

According to a conventional method, that a plurality of power supplies with various voltages are inputted directly from outside, which has following disadvantages.

(1) Large numbers of off-chip power components are required, thus causing high cost, susceptible to interference, complicated management of power supply.

(2) Large numbers of bonding pads are required since the plurality of power supplies are required to be inputted into the chip, which will occupy a large chip area and will increase a chip cost.

(3) When the power supply voltage is low and the current is high, a large voltage drop will occur on a resistance of interconnecting wires, which results in a large power loss and a bad heat dissipation.

Therefore, developing a fully integrated on-chip power supply network, which may realize a voltage and current conversion on the IC is of great importance.

SUMMARY

The present disclosure is aimed to solve at least one of the problems. Accordingly, a chip with a semiconductor electricity conversion structure is provided with a small volume, a low loss of voltage drop, and a fully integrated on-chip power distribution network.

According to embodiments of the present disclosure, a chip with a semiconductor electricity conversion structure is provided. The chip comprises: a substrate; and at least one semiconductor electricity conversion structure formed on the substrate, the at least one semiconductor electricity conversion structure comprising: at least one semiconductor electricity-to-light conversion unit for converting an input electric energy into a light energy, and at least one semiconductor light-to-electricity conversion unit for converting the light energy back into an output electric energy, in which an emitting spectrum of the semiconductor electricity-to-light conversion unit and an absorption spectrum of the semiconductor light-to-electricity conversion unit are matched with each other.

In one embodiment, the at least one semiconductor electricity-to-light conversion unit forms an AC (alternating current) input module for converting an input AC electric energy into the light energy, with each semiconductor electricity-to-light conversion unit having an electricity-to-light conversion layer; and the at least one semiconductor light-to-electricity conversion unit forms an AC output module for converting the light energy into an output AC electric energy, with each semiconductor light-to-electricity conversion unit having a light-to-electricity conversion layer, in which an emitting spectrum of each semiconductor electricity-to-light conversion unit and an absorption spectrum of each semiconductor light-to-electricity conversion unit are matched with each other.

In one embodiment, the AC input module comprises: a first input branch, working in a positive half cycle of an input AC current, the first input branch comprising $M_1$ semiconductor electricity-to-light conversion units connected in series, where $M_1$ is a positive integer; and a second input branch, connected with the first input branch in parallel and working in a negative half cycle of the input AC current, the second input branch comprising $M_2$ semiconductor electricity-to-light conversion units connected in series, where $M_2$ is a positive integer.

In one embodiment, the AC output module comprises: a first output branch, where a light transmission path is formed between the first output branch and the first input branch, the first output branch comprises $N_1$ semiconductor light-to-electricity conversion units connected in series, and $N_1$ is a positive integer; and a second output branch, connected with the first output branch in parallel, where polarities of the first output branch and the second output branch are opposite, a light transmission path is formed between the second output branch and the second input branch, the second output branch and comprises $N_2$ semiconductor light-to-electricity conversion units connected in series, where $N_2$ is a positive integer.

In one embodiment, the at least one semiconductor electricity-to-light conversion unit forms an AC input module for converting an input AC electric energy into the light enemy, with each semiconductor electricity-to-light conversion unit having an electricity-to-light conversion layer; and the at least one semiconductor light-to-electricity conversion unit forms a DC (direct current) output module for converting the light energy into an output DC electric energy, with each semiconductor light-to-electricity conversion unit having a light-to-electricity conversion layer; in which an emitting spectrum of each semiconductor electricity-to-light conversion unit and an absorption spectrum of each semiconductor light-to-electricity conversion unit are matched with each other.

In one embodiment, the AC input module comprises: a first input branch, working in a positive half cycle of an input AC current, the first input branch comprising $M_1$ semiconductor electricity-to-light conversion units connected in series, where $M_1$ is a positive integer; and a second input branch, connected with the first input branch in parallel and working in a negative half cycle of the input AC current, the second input branch comprising $M_2$ semiconductor electricity-to-light conversion units connected in series, where $M_2$ is a positive integer.

In one embodiment, the DC output module comprises: a first output branch, where a light transmission path is formed between the first output branch and the first input branch, and the first output branch comprises $N_1$ semiconductor light-to-electricity conversion units connected in series, where $N_1$ is a positive integer; and a second output branch, connected with the first output branch in parallel, where polarities of the first output branch and the second output branch are same, a light transmission path is formed between the second output branch and the second input branch, and the second output branch comprises $N_2$ semiconductor light-to-electricity conversion units connected in series, where $N_2$ is a positive integer.

In one embodiment, the at least one semiconductor electricity-to-light conversion unit forms a DC input module for converting an input DC electric energy into the light energy, with each semiconductor electricity-to-light conversion unit having an electricity-to-light conversion layer; and the at least one semiconductor light-to-electricity conversion unit forms an AC output module for converting the light energy into an output AC electric energy, with each semiconductor light-to-electricity conversion unit having a light-to-electricity conversion layer; in which an emitting spectrum of each semiconductor electricity-to-light conversion unit and an absorption spectrum of each semiconductor light-to-electricity conversion unit are matched with each other.

In one embodiment, the DC input module comprises: a first input branch, comprising $M_1$ semiconductor electricity-to-light conversion units connected in series and a first control switch, the first control switch switching the first input branch on in a positive half cycle of an output AC current, where $M_1$ is a positive integer; and a second input branch, connected with the first input branch in parallel and comprising $M_2$ semiconductor electricity-to-light conversion units connected in series and a second control switch, the second control switch switching the second input branch on in a negative half cycle of the output AC current, where $M_2$ is a positive integer.

In one embodiment, the AC output module comprises: a first output branch, where a light transmission path is formed between the first output branch and the first input branch, and the first output branch comprises $N_1$ semiconductor light-to-electricity conversion units connected in series, where $N_1$ is a positive integer; and a second output branch, connected with the first output branch in parallel, where polarities of the first output branch and the second output branch are opposite, a light transmission path is formed between the second output branch and the second input branch, and the second output branch comprises $N_2$ semiconductor light-to-electricity conversion units connected in series, where $N_2$ is a positive integer.

In one embodiment, the at least one semiconductor electricity-to-light conversion unit forms a DC input module for converting an input DC electric energy into the light energy, with each semiconductor electricity-to-light conversion unit having an electricity-to-light conversion layer; and the at least one semiconductor light-to-electricity conversion unit forms a DC output module for converting the light energy into an output DC electric energy, with each semiconductor light-to-electricity conversion unit having a light-to-electricity conversion layer; in which an emitting spectrum of each semiconductor electricity-to-light conversion unit and an absorption spectrum of each semiconductor light-to-electricity conversion unit are matched with each other.

In one embodiment, the chip may further comprise an isolation layer, in which the at least one semiconductor electricity-to-light conversion unit is located at one side of the isolation layer, the at least one semiconductor light-to-electricity conversion unit is located at the other side of the isolation layer, each semiconductor electricity-to-light conversion unit comprises an electricity-to-light conversion layer, and the isolation layer is transparent to a working light emitted by the electricity-to-light conversion layer.

In one embodiment, the chip may further comprise an isolation layer having a reflecting structure, in which the at least one semiconductor electricity-to-light conversion unit and the at least one semiconductor light-to-electricity conversion unit are located at a same side of the isolation layer and arranged alternately, each semiconductor electricity-to-light conversion unit comprises an electricity-to-light conversion layer, each semiconductor light-to-electricity conversion unit comprises a light-to-electricity conversion layer, the isolation layer is transparent to a working light emitted by the electricity-to-light conversion layer, and the reflecting structure is used for reflecting the working light from the electricity-to-light conversion layer onto the light-to-electricity conversion layer.

In one embodiment, the chip may further comprise a light trapping structure for trapping a light within the semiconductor electricity conversion structure to reduce an energy loss caused by a light loss.

In one embodiment, the chip may further comprise a light trap for trapping a light within the chip to prevent an energy loss caused by a light leakage.

In one embodiment, a refractive index of a material of each layer in a light transmission path is matched with each other.

In one embodiment, at least one of the semiconductor electricity-to-light conversion unit, the isolation layer and the semiconductor light-to-electricity conversion unit has a roughened surface, a patterned surface or a photonic crystal structure.

In one embodiment, a material of the isolation layer is an insulation material, comprising any one of $Al_2O_3$, AlN, $SiO_2$, MgO, $Si_3N_4$, BN, $ZrO_2$, $TiO_2$, diamond, $LiAlO_2$, $LiGaO_2$, semi-insulating GaAs, semi-insulating SiC, semi-insulating GaP, GaN and a combination thereof; or any one of a rare earth oxide and a combination of different rare earth oxides. $SiO_2$ and $Si_3N_4$ mostly used in an IC process are preferred.

In one embodiment, a material of the isolation layer is a semiconductor material, comprising any one of GaP, GaAs, InP, GaN, Si, Ge, GaSb, other semiconductor material transparent to the working light, and a combination thereof. Thus, an isolation between the semiconductor electricity-to-light conversion unit and the isolation layer and/or an isolation between the semiconductor light-to-electricity conversion unit and the isolation layer is realized by a reverse biased PN junction structure.

In one embodiment, the semiconductor electricity-to-light conversion unit comprises: a light emitting diode, a resonant cavity light emitting diode, a laser diode, a quantum dot light emitting device and an organic light emitting device.

In one embodiment, a material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

In one embodiment, the semiconductor light-to-electricity conversion unit comprises: a semiconductor photovoltaic device, a quantum dot photovoltaic device and an organic material photovoltaic device.

In one embodiment, a material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

In one embodiment, a material of an electrode layer in the light transmission path is a transparent conductive material, comprising any one of GaAs, GaN, AlGaInP, AlGaInN, AlGaInAs, ITO, $SnO_2$, ZnO, grapheme and a combination thereof.

In one embodiment, a transparent insulating dielectric is filled between the semiconductor electricity-to-light conversion units, between the semiconductor light-to-electricity conversion units, or between the semiconductor electricity-to-light conversion unit and the semiconductor light-to-electricity conversion unit, and a top of the transparent insulating dielectric is covered with a reflecting layer; or a reflecting insulating dielectric is filled between the semiconductor electricity-to-light conversion units, between the semiconductor light-to-electricity conversion units, or between the semiconductor electricity-to-light conversion unit and the semiconductor light-to-electricity conversion unit.

In one embodiment, the chip may further comprise one or more pins, connected with an external power supply; an on-chip power supply distribution network, connected with the one or more pins and the at least one semiconductor electricity conversion structure; and a circuit function module, connected with the at least one semiconductor electricity conversion structure, in which an input end of the semiconductor electricity conversion structure is connected with the on-chip power supply distribution network, an output end of the semiconductor electricity conversion structure is connected with the circuit function module.

In one embodiment, the chip may further comprise at least one adjusting and controlling module, connected with the at least one semiconductor electricity conversion structure for performing a power adjusting control to the semiconductor electricity conversion structure according to an output of the semiconductor electricity conversion structure.

In one embodiment, the chip is fully integrated, and a material of a substrate of the chip comprises any one of Si, SiGe, GaAs, InP, SiC, $Al_2O_3$ and a flexible material.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
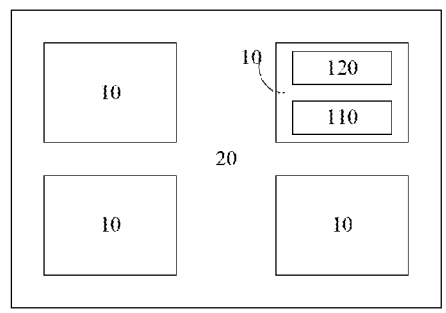
FIG. 1 is a schematic structural view of a chip according to an embodiment of the present disclosure.

Embodiments of the present disclosure will be described in detail in the following descriptions, examples of which are shown in the accompanying drawings, in which the same or similar units and units having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

A chip with a semiconductor electricity conversion structure is provided. As shown in FIG. 1, the chip comprises: a substrate 20; and at least one semiconductor electricity conversion structure 10 formed on the substrate 20. The at least one semiconductor electricity conversion structure further comprises: at least one semiconductor electricity-to-light conversion unit 110 for converting an input electric energy into a light energy, and at least one semiconductor light-to-electricity conversion unit 120 for converting the light energy back into an output electric energy. An emitting spectrum of the semiconductor electricity-to-light conversion unit 110 and an absorption spectrum of the semiconductor light-to-electricity conversion unit 120 are matched with each other. It should be noted that, numbers of the semiconductor electricity conversion structure 10, the semiconductor electricity-to-light conversion unit 110 and the semiconductor light-to-electricity conversion unit 120 shown in FIG. 1 are merely for the convenience of illustration, but shall not be construed to limit the present disclosure.

In one embodiment, the semiconductor electricity conversion structure may comprise one semiconductor electricity-to-light conversion unit and a plurality of semiconductor light-to-electricity conversion units.

In another embodiment, the semiconductor electricity conversion structure may comprise a plurality of semiconductor electricity-to-light conversion units and one semiconductor light-to-electricity conversion unit.

In another embodiment, the semiconductor electricity conversion structure may comprise a plurality of semiconductor electricity-to-light conversion units and a plurality of semiconductor light-to-electricity conversion units.

In another embodiment, the semiconductor electricity conversion structure may comprise one semiconductor electricity-to-light conversion unit and one semiconductor light-to-electricity conversion unit.

In addition, in a preferred embodiment, the plurality of semiconductor electricity-to-light conversion units and the plurality of semiconductor light-to-electricity conversion units may be connected in series. In another embodiment, the plurality of semiconductor light-to-electricity conversion structures may be connected in parallel and/or in series-parallel.

A working principle and a schematic structure of the semiconductor electricity conversion structure will be illustrated with reference to FIG. 2 and FIG. 3, in which a DC input and a DC output are used as examples.

Figure 2:
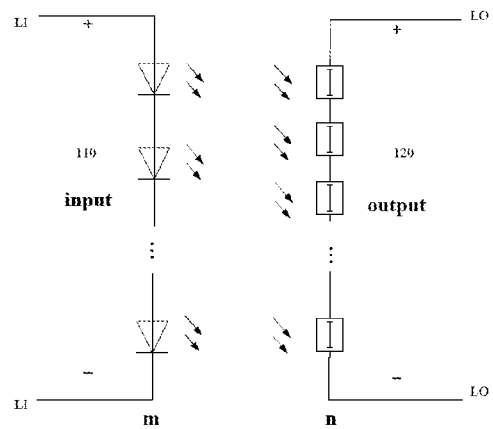
FIG. 2 is a schematic working principle diagram of a semiconductor electricity conversion structure on a chip according to an embodiment of the present disclosure.

A schematic working principle diagram of a semiconductor electricity conversion structure on a chip according to an embodiment is shown in FIG. 2. Input wires LI of an input end are connected with the semiconductor electricity-to-light conversion unit 110, and output wires LO of an output end are connected with the semiconductor light-to-electricity conversion unit 120. The semiconductor electricity-to-light conversion unit 110 comprises m light emitting diodes (LED), resonant cavity light emitting diodes (RC-LED) or laser diodes (LD) with a DC working voltage V1. The semiconductor light-to-electricity conversion unit 120 comprises n photovoltaic cells with a photovoltage V2. A spectrum of a light emitted by the semiconductor electricity-to-light conversion unit 110 is matched with that of a light with an optimized light-to-electricity conversion efficiency emitted by the semiconductor light-to-electricity conversion unit 120, that is, working lights of the semiconductor electricity-to-light conversion unit 110 and the semiconductor light-to-electricity conversion unit 120 are matched with each other so as to increase an energy conversion efficiency of the semiconductor electricity conversion structure and reduce an energy loss in a voltage transformation process. During a working process, the semiconductor electricity-to-light conversion unit 110 emits the light when a proper voltage is applied to input terminals of the semiconductor electricity-to-light conversion unit 110. Photons are transmitted to the semiconductor light-to-electricity conversion unit 120 to excite out non-equilibrium carriers, which will then be separated by the internal electric field, and consequently a photovoltage and a photocurrent are generated, thus realizing an energy transmission via photons. During above energy transmission process, total output voltage/total input voltage is calculated as $(n*V_2)/(m*V_1)$.

With the chip with the semiconductor electricity conversion structure according to an embodiment of the present disclosure, by forming the electricity-to-light conversion structure at an input end of the semiconductor electricity conversion structure, a DC electric energy is converted into a light for transmission; and by forming the light-to-electricity conversion structure at an output end of the semiconductor electricity conversion structure, the light is converted back into a DC electric energy for outputting. Moreover, by connecting different numbers of electricity-to-light conversion units and light-to-electricity conversion units in series at the input end and the output end respectively, a DC voltage transformation may be realized by a working voltage difference between the electricity-to-light conversion unit and the light-to-electricity conversion unit and a number ratio of the electricity-to-light conversion units to the light-to-electricity conversion units. Then the output of the semiconductor electricity conversion structure is connected with a load circuit on the chip. Furthermore, the chip may be fully integrated, which can not realized by a prior art.

In order to make those skilled in the art better understand the present disclosure, principles of the conventional technologies and the present disclosure are illustrated herein. A conventional AC transformer follows an electromagnetic theory, while the semiconductor voltage transformation structure follows a quantum theory. Photons emitted by bound electron transitions between the energy bands in semiconductors are the energy transmission media, instead of an electromagnetic fields generated by free electrons oscillating in conductors. A particle behavior must therefore be considered, rather than a wave behavior, in an analysis of a fundamental working principle of this semiconductor voltage transformation structure. In the semiconductor voltage transformation structure, an individual photon energy corresponds to the device characteristic voltage, while a number of photons corresponds to a current flowing through a device.

A total energy conversion efficiency of the semiconductor electricity conversion structure is determined by the electricity-to-light conversion efficiency, the light-to-electricity conversion efficiency, and the light losses. The electricity-to-light conversion efficiency and light-to-electricity conversion efficiency have already reached very high levels in current light-emitting and photovoltaic devices. With the development of high quality materials and advanced device structures, the internal quantum efficiencies (IQE), which indicate the conversion efficiencies between photons (light) and electrons (electricity) for both kinds of device, have improved greatly. For LEDs, IQE values of 80% for blue GaN LEDs, and nearly 100% for red AlGaInP LEDs have been achieved; and for photovoltaic devices, nearly 99% for GaAs and more than 97% for InGaN have been reported. The low efficiencies in LEDs are largely because of the refractive index mismatch between the LED and air, and the low efficiencies in photovoltaic cells for solar power applications are largely because of the spectral mismatch between the solar spectrum and the absorption spectrum of the cells. The light loss therefore becomes the most important factor in determining the efficiency of DC transformers, provided that state-of-the-art light-emitting devices and photovoltaic devices are used. Three technologies are provided in the present disclosure to reduce the light loss as far as possible, thus improving the energy conversion efficiency. The three technologies are: a spectrum matching between an emitting spectrum of the electricity-to-light conversion unit and an absorption spectrum of the light-to-electricity conversion unit to reduce a non-absorption loss of the photons and a thermalization loss, a refractive indices matching of materials on a light transmission path to reduce a total reflection loss and a Fresnel loss, and a light trap to reduce the energy loss caused by a light leakage. The three technologies will be illustrated in detail hereinafter.

Figure 3:
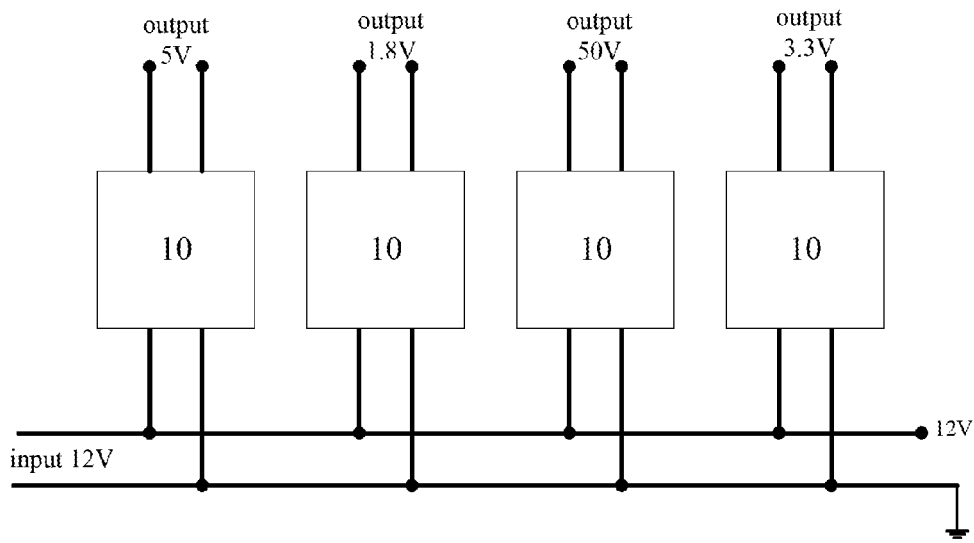
FIG. 3 is a schematic structural view of a chip according to an embodiment of the present disclosure.

FIG. 3 is a schematic structural view of a chip according to an embodiment of the present disclosure. As shown in FIG. 3, the chip has four semiconductor electricity conversion structures 10, which may convert a DC input voltage 12V into output voltages 5V, 1.8V, 50V and 3.3V, in which 12V is a common DC input voltage, 5V and 3.3V are common analog supply voltages, 1.8V is a common digital supply voltage, and 50V is common MEMS supply voltage. This chip can realize outputting a plurality of different supply voltages to drive different DC function modules with a provision of one input voltage.

In one embodiment, the chip may further comprise a light trap for trapping a light within the chip to prevent an energy loss caused by a light leakage.

The semiconductor electricity conversion structure of the chip according to embodiments of the present disclosure may be approximately divided into four types, as shown in FIGS. 4-7 respectively.

A semiconductor electricity conversion structure according to a first embodiment, which is applied to an AC-AC voltage transformation, will be described as follows with reference to FIGS. 4a and 4b.

Figure 4A:
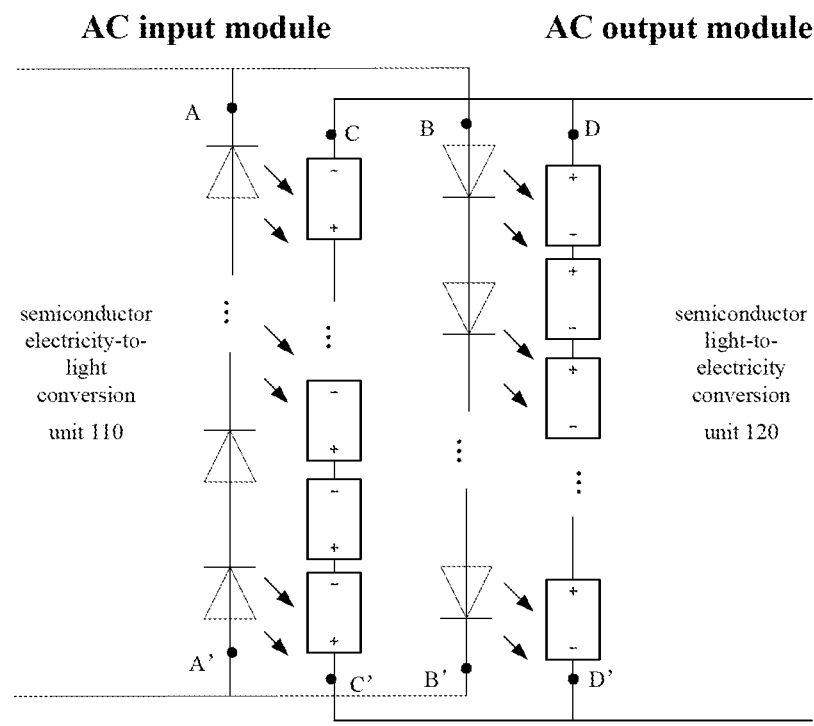
FIGS. 4a and 4b are a schematic working principle diagram and a cross-sectional view of a semiconductor electricity conversion structure according to an embodiment of the present disclosure respectively.

As shown in FIG. 4a, a semiconductor electricity conversion structure is provided. The semiconductor electricity conversion structure comprises: an AC input module for converting an input AC electric energy into a light energy and an AC output module for converting the light energy into an output AC electric energy. The AC input module comprises a plurality of semiconductor electricity-to-light conversion units, and each semiconductor electricity-to-light conversion unit comprises an electricity-to-light conversion layer. The AC output module comprises a plurality of semiconductor light-to-electricity conversion units, and each semiconductor light-to-electricity conversion unit comprises a light-to-electricity conversion layer. There is a spectrum matching between an emitting spectrum of each semiconductor electricity-to-light conversion unit 110 and an absorption spectrum of each semiconductor light-to-electricity conversion unit 120.

In one embodiment, the AC input module comprises: a first input branch AA' and a second input branch BB' connected with the first input branch AA' in parallel. The first input branch AA' works in a positive half cycle of an input AC current, and comprises $M_1$ semiconductor electricity-to-light conversion units connected in series, where $M_1$ is a positive integer. The second input branch BB' works in a negative half cycle of the input AC current, and comprises $M_2$ semiconductor electricity-to-light conversion units connected in series, where $M_2$ is a positive integer. Preferably, $M_1=M_2$.

In one embodiment, the AC output module comprises: a first output branch CC' and a second output branch DD' connected with the first output branch CC' in parallel. Polarities of the first output branch CC' and the second output branch DD' are opposite. A light transmission path is formed between the first output branch CC' and the first input branch AA'. The first output branch CC' comprises $N_1$ semiconductor light-to-electricity conversion units connected in series, where $N_1$ is a positive integer. A light transmission path is formed between the second output branch DD' and the second input branch BB'. The second output branch DD' comprises $N_2$ semiconductor light-to-electricity conversion units connected in series, where $N_2$ is a positive integer. Preferably, $N_1=N_2$.

Figure 4B:
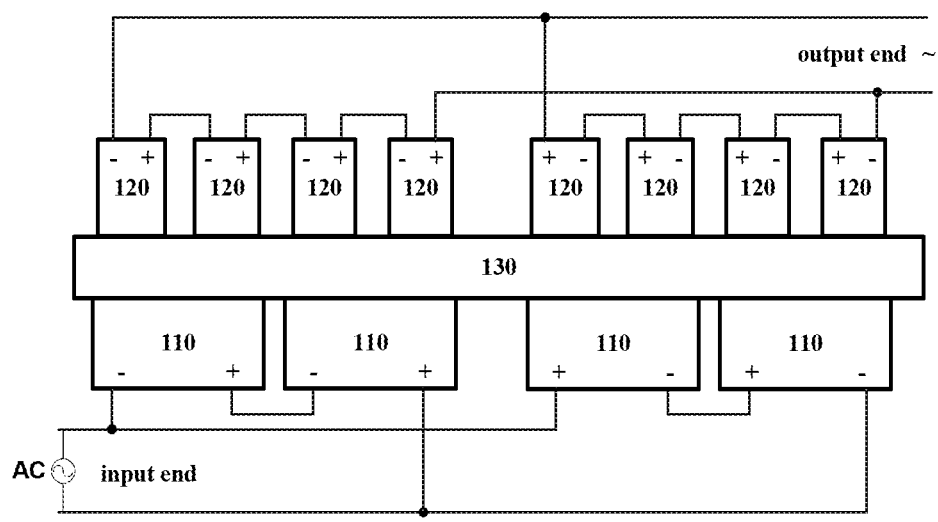

FIG. 4b further shows a cross-sectional view of the semiconductor electricity conversion structure according to the first embodiment, particularly, illustrating relative position and connection relationship among each part. As shown in FIG. 4b, in the semiconductor electricity conversion structure, two semiconductor electricity-to-light conversion units 110 are connected in series to constitute the first input branch, and another two semiconductor electricity-to-light conversion units 110 are connected in series to constitute the second input branch. The first input branch and the second input branch are connected in parallel to constitute the AC input module. Four semiconductor light-to-electricity conversion units 120 constitute the first output branch, and another four semiconductor light-to-electricity conversion units 120 are connected in series to constitute the second output branch. The first output branch and the second output branch are connected in parallel to constitute the AC output module. It should be noted that, in this embodiment, $M_1$ and $M_2$ have a value of 2, and $N_1$ and $N_2$ have a value of 4, which are explanatory and illustrative, not being construed to limit the present disclosure. According to practice, modifications of a connection mode may be made in FIG. 14b in the embodiments without departing from spirit and principles of the disclosure. The semiconductor electricity conversion structure also comprises an isolation layer 130, which will be illustrated in detail hereinafter.

In the above semiconductor electricity conversion structure, a DC voltage $V_1$ is applied to an individual semiconductor electricity-to-light conversion unit 110 of the AC input module so as to inject carriers in the individual semiconductor electricity-to-light conversion unit 110 for recombination to generate photons. The photons are transmitted to an individual semiconductor light-to-electricity conversion unit 120 so as to excite out non-equilibrium carriers, and then separated by the internal electric field, and consequently a DC voltage $V_2$ is outputted from the individual semiconductor light-to-electricity conversion unit 120, thus realizing an energy transmission via photons. During an energy transmission process, in one aspect, $V_1$ and $V_2$ are dependent on material characteristic parameters, such as a material type, a strain characteristic, a bandgap or a doping concentration, of the electricity-to-light conversion units 1 and the light-to-electricity conversion units 2 respectively so as to realize an optimization of an energy transmission efficiency by adjusting a corresponding characteristic parameter; in another aspect, a voltage transformation may be realized by a number ratio of the electricity-to-light conversion units 1 to the light-to-electricity conversion units 2. For example, in the embodiment as shown in FIG. 4b, total output voltage/total input voltage=$2V_2/V_1$. It should be noted that, the total output voltage/total input voltage may be calculated according to a same principle in any following embodiment.

A semiconductor electricity conversion structure according to a second embodiment, which is applied to an AC-DC voltage transformation, will be described as follows with reference to FIGS. 5a and 5b.

Figure 5A:
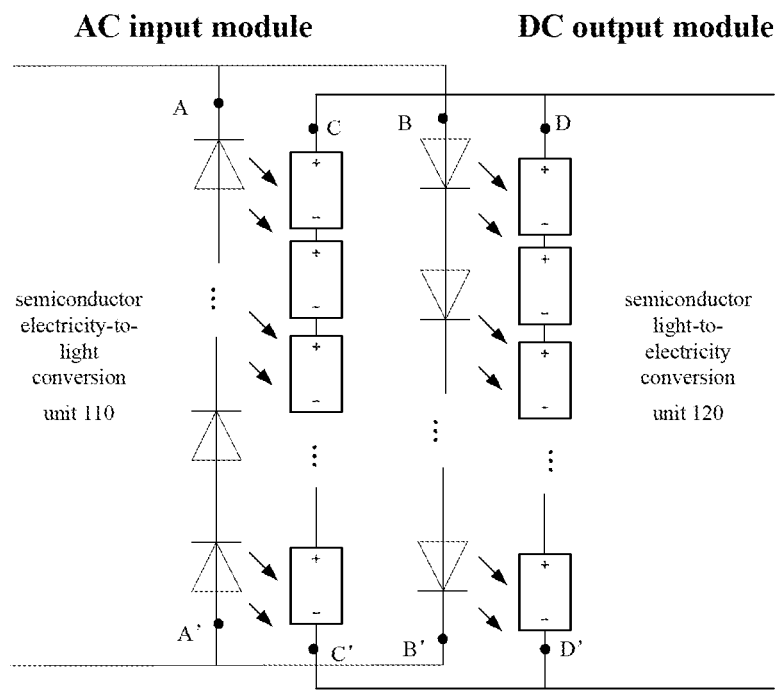
FIGS. 5a and 5b are a schematic working principle diagram and a cross-sectional view of a semiconductor electricity conversion structure according to an embodiment of the present disclosure respectively.

As shown in FIG. 5a, a semiconductor electricity conversion structure is provided. The semiconductor electricity conversion structure comprises: an AC input module for converting an input AC electric energy into a light energy, and a DC output module for converting the light energy into an output DC electric energy. The AC input module comprises a plurality of semiconductor electricity-to-light conversion units 110, and each semiconductor electricity-to-light conversion unit 110 comprises an electricity-to-light conversion layer. The DC output module comprises a plurality of semiconductor light-to-electricity conversion units 120, and each semiconductor light-to-electricity conversion unit 120 comprises a light-to-electricity conversion layer. There is a spectrum matching between an emitting spectrum of each semiconductor electricity-to-light conversion unit 110 and an absorption spectrum of each semiconductor light-to-electricity conversion unit 120.

In one embodiment, the AC input module comprises: a first input branch AA' and a second input branch BB' connected with the first input branch AA' in parallel. The first input branch AA' works in a positive half cycle of an input AC current, and comprises $M_1$ semiconductor electricity-to-light conversion units connected in series, where $M_1$ is a positive integer. The second input branch BB' works in a negative half cycle of the input AC current, and comprises M, semiconductor electricity-to-light conversion units connected in series, where $M_2$ is a positive integer. Preferably, $M_1=M_2$.

In one embodiment, the DC output module comprises: a first output branch CC' and a second output branch DD' connected with the first output branch CC' in parallel. Polarities of the first output branch CC' and the second output branch DD' are same. A light transmission path is formed between the first output branch CC' and the first input branch AA'. The first output branch CC' comprises $N_1$ semiconductor light-to-electricity conversion units connected in series, where $N_1$ is a positive integer. A light transmission path is formed between the second output branch DD' and the second input branch BB'. The second output branch DD' comprises $N_2$ semiconductor light-to-electricity conversion units connected in series, where $N_2$ is a positive integer. Preferably, $N_1=N_2$.

It should be noted that the output branch may comprise one output branch or two output branches connected in parallel. In a former case, a light transmission path is formed between the one output branch and the first input branch and between the one output branch and the second input branch. In a later case, a light transmission path is formed between one output branch and the first input branch, and a light transmission path is formed between the other output branch and the second input branch. However, in the later case, a diode for preventing reverse is required to be connected in each output branch in series to avoid a phenomenon of "one output branch working to supply voltage while the other output branch not working to became a load of the one output branch".

Figure 5B:
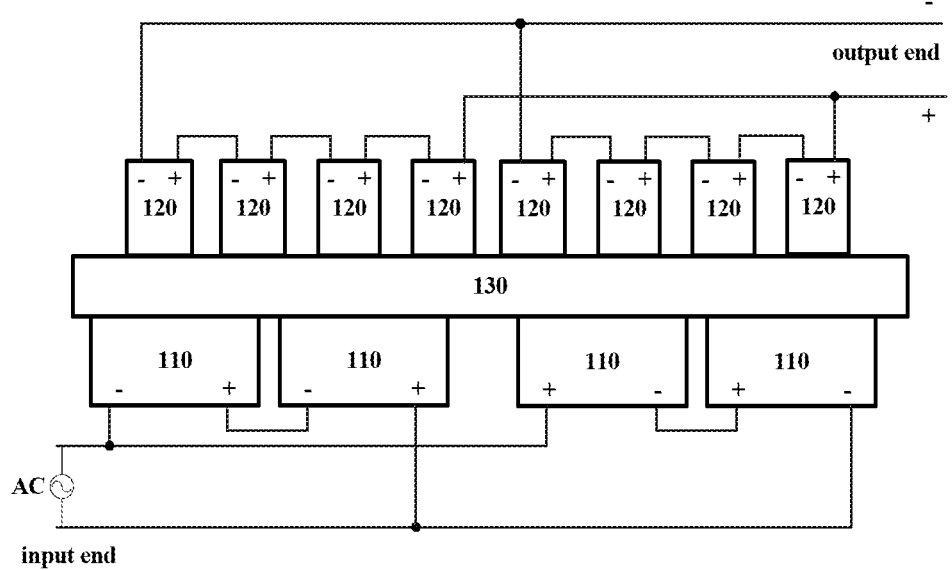

FIG. 5b further shows a cross-sectional view of the semiconductor electricity conversion structure according to the second embodiment, particularly, illustrating relative position and connection relationship among each part. As shown in FIG. 5b, in the semiconductor electricity conversion structure, four semiconductor electricity-to-light conversion units 110 constitute the first input branch and the second input branch. The first input branch and the second input branch further constitute the AC input module. Eight semiconductor light-to-electricity conversion units 120 constitute the output branch, which further constitute the DC output module. The semiconductor electricity conversion structure also comprises an isolation layer 130, which will be illustrated in detail hereinafter It should be noted that, numbers of the semiconductor electricity-to-light conversion units and the semiconductor light-to-electricity conversion units, as well as connection modes thereof shown in FIG. 5b, are explanatory and illustrative, not being construed to limit the present disclosure.

A semiconductor electricity conversion structure according to a third embodiment, which is applied to a DC-AC voltage transformation, will be described as follows with reference to FIGS. 6a and 6b.

Figure 6A:
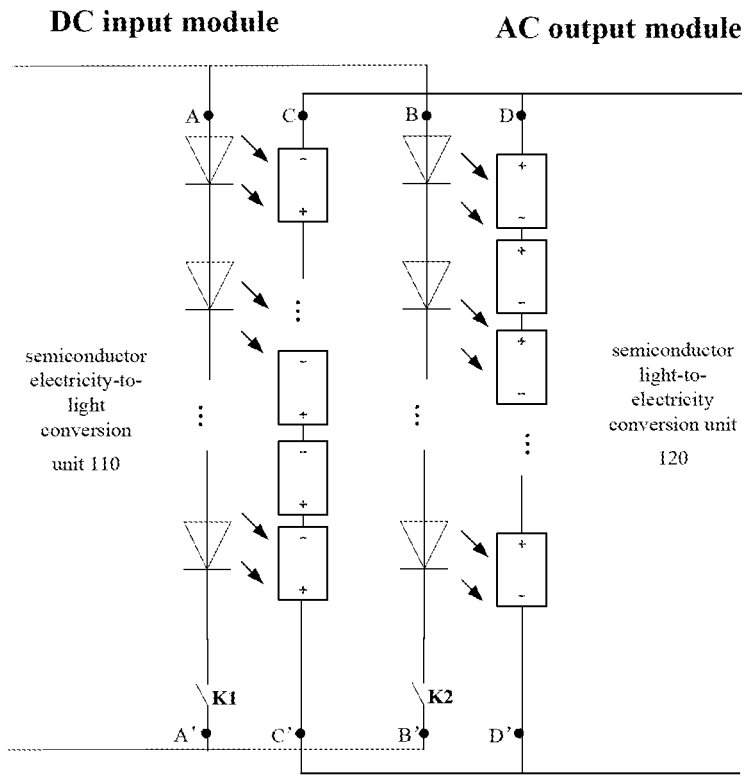
FIGS. 6a and 6b are a schematic working principle diagram and a cross-sectional view of a semiconductor electricity conversion structure according to an embodiment of the present disclosure respectively.

As shown in FIG. 6a, a semiconductor electricity conversion structure is provided. The semiconductor electricity conversion structure comprises: a DC input module for converting an input DC electric energy into a light energy, and an AC output module for converting the light energy into an output AC electric energy. The DC input module comprises a plurality of semiconductor electricity-to-light conversion units 110, and each semiconductor electricity-to-light conversion unit 110 comprises an electricity-to-light conversion layer. The AC output module comprises a plurality of semiconductor light-to-electricity conversion units 120, and each semiconductor light-to-electricity conversion unit 120 comprises a light-to-electricity conversion layer. There is a spectrum matching between an emitting spectrum of each semiconductor electricity-to-light conversion unit 110 and an absorption spectrum of each semiconductor light-to-electricity conversion unit 120.

In one embodiment, the DC input module comprises: a first input branch AA' and a second input branch BB' connected with the first input branch AA' in parallel. The first input branch AA' comprises $M_1$ semiconductor electricity-to-light conversion units 110 connected in series and a first control switch K1, where $M_1$ is a positive integer. The first control switch K1 controls the first input branch AA' on in a positive half cycle of an output AC current. The second input branch BB' comprises $M_2$ semiconductor electricity-to-light conversion units 110 connected in series and a second control switch K2, where $M_2$ is a positive integer. The second control switch K2 controls the second input branch on in a negative half cycle of the output AC current. Preferably, $M_1=M_2$.

In one embodiment, the AC output module comprises: a first output branch CC' and a second output branch DD' connected with the first output branch CC' in parallel. Polarities of the first output branch CC' and the second output branch DD' are opposite. A light transmission path is formed between the first output branch CC' and the first input branch AA'. The first output branch CC' comprises $N_1$ semiconductor light-to-electricity conversion units 120 connected in series, where $N_1$ is a positive integer. A light transmission path is formed between the second output branch DD' and the second input branch BB'. The second output branch DD' comprises $N_2$ semiconductor light-to-electricity conversion units 120 connected in series, where $N_2$ is a positive integer. Preferably, $N_1=N_2$.

Figure 6B:
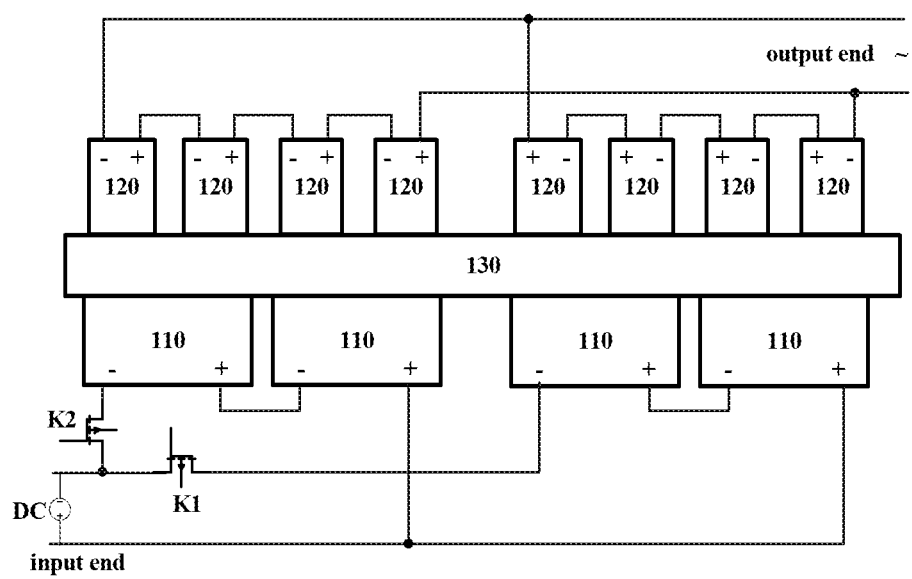

FIG. 6b further shows a cross-sectional view of the semiconductor electricity conversion structure according to the third embodiment, particularly, illustrating relative position and connection relationship among each part. As shown in FIG. 6b, in the semiconductor electricity conversion structure, four semiconductor electricity-to-light conversion units 110 and the control switches K1 and K2 constitute the first input branch and the second input branch. The first input branch and the second input branch further constitute the DC input module. Eight semiconductor light-to-electricity conversion units 120 constitute the first output branch and the second output branch, which further constitute the AC output module. The semiconductor electricity conversion structure also comprises an isolation layer 130, which will be illustrated in detail hereinafter. It should be noted that, numbers of the semiconductor electricity-to-light conversion units and the semiconductor light-to-electricity conversion units, as well as connection modes thereof shown in FIG. 6b, are explanatory and illustrative, not being construed to limit the present disclosure.

A semiconductor electricity conversion structure according to a fourth embodiment, which is applied to a DC-DC voltage transformation, will be described as follows with reference to FIGS. 7a and 7b.

Figure 7A:
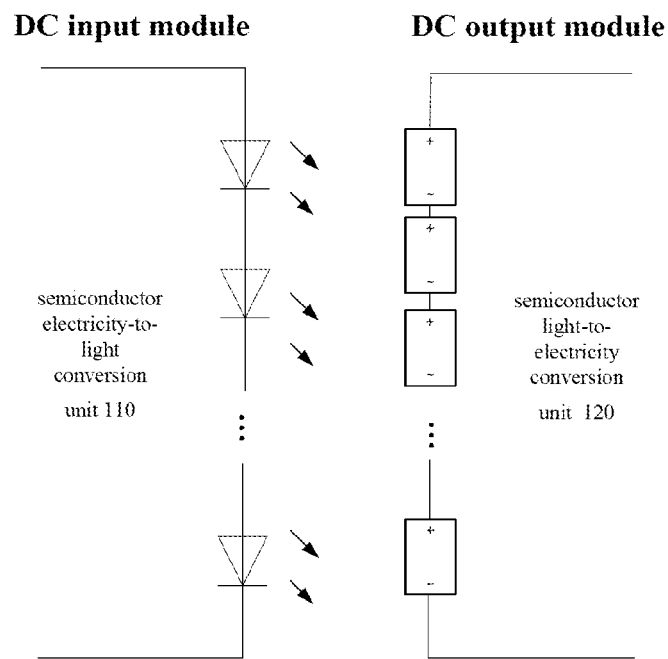
FIGS. 7a and 7b are a schematic working principle diagram and a cross-sectional view of a semiconductor electricity conversion structure according to an embodiment of the present disclosure respectively.
Figure 7B:
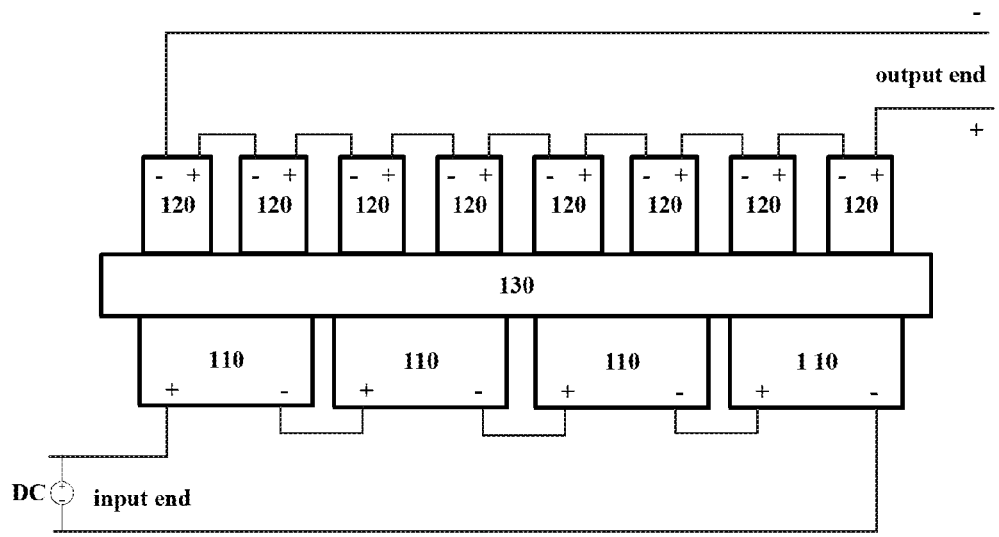

As shown in FIG. 7a, a semiconductor electricity conversion structure is provided. The semiconductor electricity conversion structure comprises: a DC input module for converting an input DC electric energy into a light energy, and a DC output module, for converting the light energy into an output DC electric energy. The DC input module comprises M semiconductor electricity-to-light conversion units, where M is a positive integer, and each semiconductor electricity-to-light conversion unit comprises an electricity-to-light conversion layer. The DC output module comprises N semiconductor light-to-electricity conversion units 120, where N is a positive integer, and each semiconductor light-to-electricity conversion unit 120 comprises a light-to-electricity conversion layer. There is a spectrum matching between an emitting spectrum of each semiconductor electricity-to-light conversion unit 110 and an absorption spectrum of each semiconductor light-to-electricity conversion unit 120.

FIG. 4b further shows a cross-sectional view of the semiconductor electricity conversion structure according to the fourth embodiment, particularly, illustrating relative position and connection relationship among each part. As shown in FIG. 4b, in the semiconductor electricity conversion structure, four semiconductor electricity-to-light conversion units 110 constitute the DC input module. Eight semiconductor light-to-electricity conversion units 120 constitute the AC output module. The semiconductor electricity conversion structure also comprises an isolation layer 130, which will be illustrated in detail hereinafter. It should be noted that, numbers of the semiconductor electricity-to-light conversion units and the semiconductor light-to-electricity conversion units, as well as connection modes thereof shown in FIG. 4b, are explanatory and illustrative, not being construed to limit the present disclosure.

For the above four semiconductor electricity conversion structures according to the above four embodiments, additional features will be described as follows.

As mentioned hereinbefore, in one embodiment, the semiconductor electricity conversion structure 10 may further comprise an isolation layer 130 for realizing an electrical isolation between the semiconductor electricity-to-light conversion unit 110 and the semiconductor light-to-electricity conversion unit 120. There are two different cases as shown in FIG. 8 and FIG. 9 respectively according to a position of the isolation layer 130, where arrows in FIG. 8 and FIG. 9 represent transmission directions of the working light.

Figure 8:
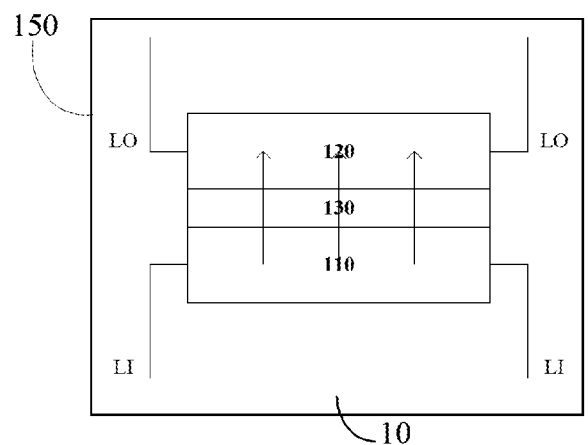
FIG. 8 is a schematic structural view of a semiconductor electricity conversion structure on a chip according to an embodiment of the present disclosure.

As shown in FIG. 8, the semiconductor electricity conversion structure 10 has a double-layer structure. The at least one semiconductor electricity-to-light conversion unit 110 comprising the electricity-to-light conversion layer and the at least one semiconductor light-to-electricity conversion unit 120 comprising the light-to-electricity conversion layer are located at both sides of the isolation layer 130 respectively. The isolation layer 130 is transparent to the working light emitted by the electricity-to-light conversion layer, and the working light is transmitted in a way of transmission.

Figure 9:
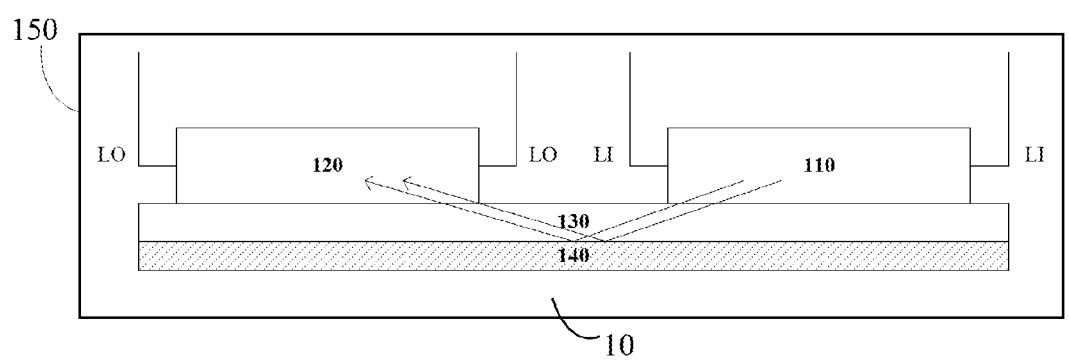
FIG. 9 is a schematic structural view of a semiconductor electricity conversion structure on a chip according to an embodiment of the present disclosure.

As shown in FIG. 9, the semiconductor electricity conversion structure 10 has a single-layer structure. The isolation layer 130 is located at a bottom or a top of the semiconductor electricity conversion structure 10. The isolation layer 130 has a reflecting structure 140. The at least one semiconductor electricity-to-light conversion unit 110 comprising the electricity-to-light conversion layer and the at least one semiconductor light-to-electricity conversion unit 120 comprising the light-to-electricity conversion layer are located at a same side of the isolation layer 130 and arranged alternately. The isolation layer 130 is transparent to the working light emitted by the electricity-to-light conversion layer, and the reflecting structure 140 is used for reflecting the working light from the electricity-to-light conversion layer to the light-to-electricity conversion layer.

In addition, in order to obtain a good light-to-electricity energy conversion efficiency, a total reflection occurring at each interface during a light transmission process from the electricity-to-light conversion layer to the light-to-electricity conversion layer should be avoided. Because the total reflection occurs if and only if a light enters from a material with a larger refractive index to a material with a smaller refractive index, an occurrence of the total reflection may be avoided merely by properly matching the refractive index of each layer of material in a direction of light transmission. In order to reduce the total reflection of the working light occurring at each interface, the refractive index of each layer of material in a direction of light transmission is required to satisfy a matching condition. Specifically, in one embodiment, refractive indices of materials of the electricity-to-light conversion unit 110, the isolation layer 130, and the light-to-electricity conversion unit 120 are approximate. In another embodiment, the refractive indices of materials of the electricity-to-light conversion unit 110, the isolation layer 130, and the light-to-electricity conversion unit 120 are increased sequentially or substantially same. In one embodiment, at least one of the electricity-to-light conversion unit 110, the isolation layer 130, and the light-to-electricity conversion unit 120 has a roughened surface, a patterned surface or a photonic crystal structure to decrease the total reflection of light at the interface, which will be favorable for the transmission of the working light and the energy conversion.

In one embodiment, a material of the isolation layer 130 may be a solid transparent insulating or semi-insulating material, comprising any one of $Al_2O_3$, $Y_2O_3$, $Gd_2O_3$, AlN, $SiO_2$, MgO, CaO, $Si_1N_4$, BN, diamond, $LiAlO_2$, $LiGaO_2$, GaAs, SiC, $TiO_2$, $ZrO_2$, $SrTiO_3$, $Ga_2O_3$, ZnS, CdTe, SiC, $MgAl_2O_4$, $LiNbO_3$, $LiTaO_3$, $Y_3Al_5O_{12}$, $KNbO_3$, LiF, $MgF_2$, $BaF_2$, $GaF_2$, $LaF_3$, BeO, GaP, GaN and a combination thereof; or any one of a rare earth oxide and a combination of different rare earth oxides. When taking into account of a lattice matching and a process condition, preferably, the material of the isolation layer 130 may be $Al_2O_3$, AlN, $SiO_2$, MgO, $Si_3N_4$, BN, diamond, $LiAlO_2$, $LiGaO_2$, semi-insulating GaAs, semi-insulating SiC, semi-insulating GaP, GaN and a combination thereof; or any one of a rare earth oxide and a combination of different rare earth oxides. In this embodiment, the electrical isolation is realized by an insulation characteristic of the material.

In another embodiment, the electrical isolation may be realized by a reverse biased PN junction structure. The material of the isolation layer 130 may be a semiconductor material, comprising any one of GaP, GaAs, InP, GaN, Si, Ge, GaSb, and a combination thereof. The material of the isolation layer 130 is transparent to the working light, which means that a bandgap of the substrate layer 130 is larger than the energy of the photon so as to ensure the nonoccurrence of transitions between energy bands which may cause the loss of the photons.

The semiconductor electricity conversion structure with a semiconductor isolation layer will be illustrated in detail as follows with reference to FIGS. 10-13.

Figure 10:
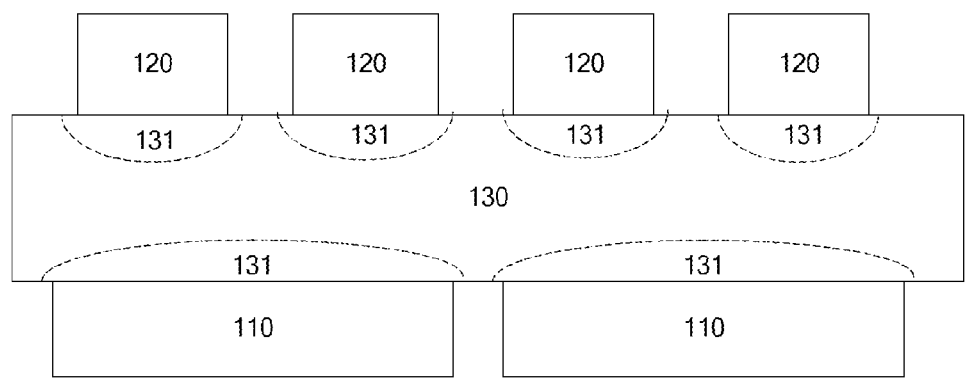
FIG. 10 is a cross-sectional view of a semiconductor electricity conversion structure with a semiconductor isolation layer according to an embodiment of the present disclosure.

FIG. 10 is a cross-sectional view of the semiconductor electricity conversion structure according to one embodiment of the present disclosure. As shown in FIG. 10, the semiconductor electricity conversion structure comprises a plurality of semiconductor electricity-to-light conversion units 110 connected in series, a plurality of semiconductor light-to-electricity conversion units 120 connected in series and an isolation layer 130. The plurality of semiconductor electricity-to-light conversion units 110 are formed at one side of the isolation layer 130, and each semiconductor electricity-to-light conversion unit 110 comprises an electricity-to-light conversion layer (not shown in FIG. 10). The plurality of semiconductor light-to-electricity conversion units 120 are formed at the other side of the isolation layer 130, and each semiconductor light-to-electricity conversion unit 120 comprises a light-to-electricity conversion layer (not shown in FIG. 10). The isolation layer 130 is transparent to the working light emitted by the electricity-to-light conversion layer, to allow the light carrying energy to be transmitted from the semiconductor electricity-to-light conversion units 110 to the semiconductor light-to-electricity conversion units 120, thus realizing the energy transmission and eventually realizing the voltage transformation. A material of the isolation layer 130 may be of a first doping type and any one of GaP, GaAs, InP, GaN, Si, Ge, GaSb, other semiconductor material transparent to the working light, and a combination thereof. A doped region 131 of a second doping type is formed between the isolation layer 130 and the plurality of semiconductor electricity-to-light conversion units 110 and between the isolation layer 130 and the plurality of semiconductor light-to-electricity conversion units 120 respectively, and one PN junction structure formed by the isolation layer 130 and the doped regions 131 is reverse biased. Specifically, when the isolation layer 130 is P-type doped and the doped regions 131 are N-type doped, a low potential may be applied to the isolation layer 130 and a high potential may be applied to the doped regions 131. Or when the isolation layer 130 is N-type doped and the doped regions 131 are P-type doped, a high potential may be applied to the isolation layer 130 and a low potential may be applied to the doped regions 131. Therefore, all PN junction structures between the plurality of semiconductor electricity-to-light conversion units 110 and the plurality of semiconductor light-to-electricity conversion units 120 are reverse biased so that the carriers can not pass through, thus realizing the electrical isolation and avoiding interaction between the input end and the output end.

Figure 11:
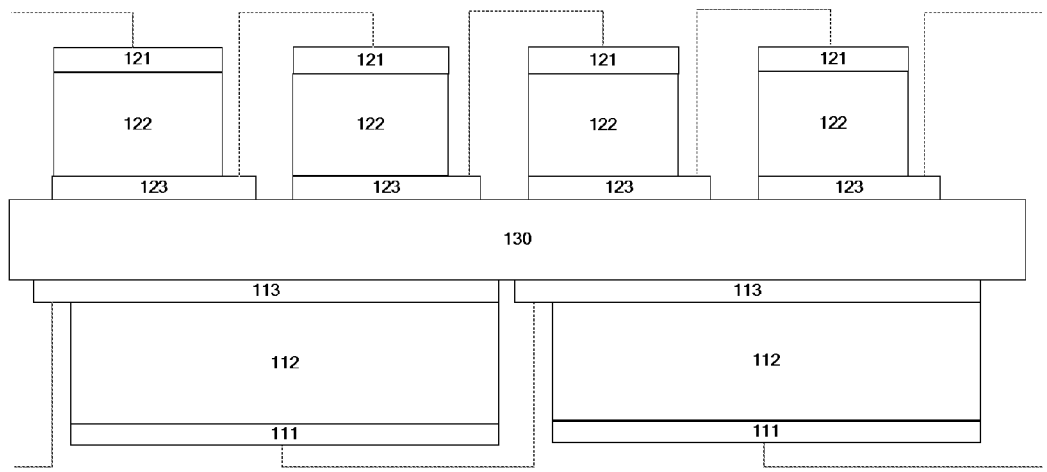
FIG. 11 is a cross-sectional view of a semiconductor electricity conversion structure with a semiconductor isolation layer according to an embodiment of the present disclosure.

FIG. 11 is a cross-sectional view of the semiconductor electricity conversion structure according to one embodiment of the present disclosure. As shown in FIG. 11, the semiconductor electricity conversion structure comprises a plurality of semiconductor electricity-to-light conversion units 110 connected in series, a plurality of semiconductor light-to-electricity conversion units 120 connected in series and an isolation layer 130. The plurality of semiconductor electricity-to-light conversion units 110 are formed at one side of the isolation layer 130, and the plurality of semiconductor light-to-electricity conversion units 120 are formed at the other side of the isolation layer 130. The isolation layer 130 is transparent to the working light emitted by the electricity-to-light conversion layer 112. A material of the isolation layer 130 may be of a first doping type and any one of GaP, GaAs, InP, GaN, Si, Ge, GaSb, other semiconductor material transparent to the working light, and a combination thereof. Each semiconductor electricity-to-light conversion unit 110 comprises a first semiconductor doped layer 111, the electricity-to-light conversion layer 112 and a second semiconductor doped layer 113 contacting with the isolation layer 130. The first semiconductor doped layer 111 is of the first doping type, the second semiconductor doped layer 113 is of the second doping type, and a PN junction structure formed by the isolation layer 130 and the second semiconductor doped layer 113 is reverse biased. The semiconductor light-to-electricity conversion unit 120 comprises a third semiconductor doped layer 121, the light-to-electricity conversion layer 122 and a fourth semiconductor doped layer 123 contacting the isolation layer 130. The third semiconductor doped layer 121 is of the first doping type, the fourth semiconductor doped layer 123 is of the second doping type, and a PN junction structure formed by the isolation layer 130 and the fourth semiconductor doped layer 123 is reverse biased. Similar with the embodiment above, in this embodiment, the PN junction structures between the plurality of semiconductor electricity-to-light conversion units 110 and the plurality of semiconductor light-to-electricity conversion units 120 are reverse biased to realize the electrical isolation, thus avoiding interaction between the input end and the output end.

Figure 12:
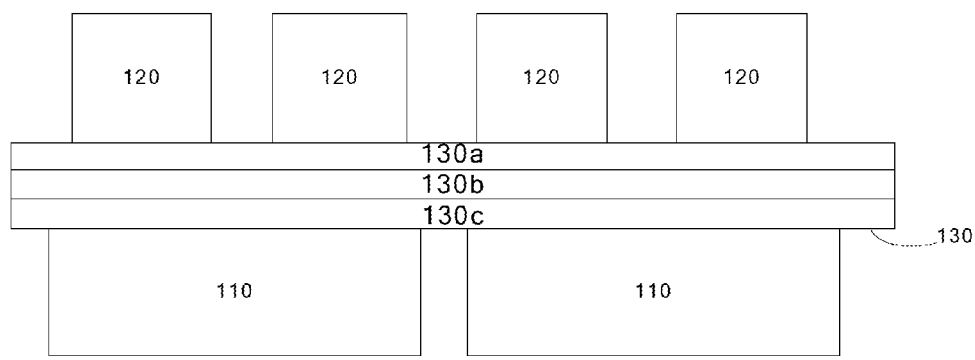
FIG. 12 is a cross-sectional view of a semiconductor electricity conversion structure with a semiconductor isolation layer according to an embodiment of the present disclosure.

FIG. 12 is a cross-sectional view of the semiconductor electricity conversion structure according to one embodiment of the present disclosure. As shown in FIG. 12, the semiconductor electricity conversion structure comprises a plurality of semiconductor electricity-to-light conversion unit 110 connected in series, a plurality of semiconductor light-to-electricity conversion units 120 connected in series and an isolation layer 130. The plurality of semiconductor electricity-to-light conversion unit 110 are formed at one side of the isolation layer 130, and each semiconductor electricity-to-light conversion unit 110 comprises an electricity-to-light conversion layer (not shown in FIG. 12). The plurality of semiconductor light-to-electricity conversion units 120 are formed at the other side of the isolation layer 130, and each semiconductor light-to-electricity conversion unit 120 comprises a light-to-electricity conversion layer (not shown in FIG. 12). The isolation layer 130 is transparent to the working light emitted by the electricity-to-light conversion layer, to allow the light carrying energy to be transmitted from the semiconductor electricity-to-light conversion unit 110 to the semiconductor light-to-electricity conversion units 120, thus realizing the energy transmission and eventually realizing the voltage transformation. A material of the isolation layer 130 may be any one of GaP, GaAs, InP, GaN, Si, Ge, GaSb, other semiconductor material transparent to the working light, and a combination thereof. The isolation layer 130 has a plurality of semiconductor doped layers. For example, the isolation layer 130 comprises a first semiconductor doped layer 130a, a second semiconductor doped layer 130b and a third semiconductor doped layer 130c. Doping types of the first semiconductor doped layer 130a and the second semiconductor doped layer 130b are opposite, while doping types of the second semiconductor doped layer 130b and the third semiconductor doped layer 130c are opposite. Thus, a first PN junction at an interface between the first semiconductor doped layer 3a and the second semiconductor doped layer 3b and a second PN junction at an interface between the second semiconductor doped layer 3b and the third semiconductor doped layer 3c are formed between the plurality of semiconductor electricity-to-light conversion unit 110 and the plurality of semiconductor light-to-electricity conversion units 120. Both the first PN junction and the second PN junction are reverse biased to realize the electrical isolation, thus avoiding interaction between the input end and the output end. It should be noted that the isolation layer 130 may also comprise larger number of semiconductor doped layers with ensured that at least two groups of adjacent semiconductor doped layers have opposite doping types to form at least two PN junctions and enable the at least two PN junctions to be reverse biased. The electrical isolation is thus realized to avoid interaction between the input end and the output end.

It should be noted that, in the embodiments shown in FIGS. 10-12, the plurality of semiconductor electricity-to-light conversion units 110 may be located on the isolation layer 130, while the plurality of semiconductor light-to-electricity conversion units 120 may be located under the isolation layer 130. Alternatively, the plurality of semiconductor electricity-to-light conversion units 110 may be located under the isolation layer 130, while the plurality of semiconductor light-to-electricity conversion units 120 may be located on the isolation layer 130. An exchange of a relative position does not substantially influence a work of the semiconductor electricity conversion structure.

Figure 13:
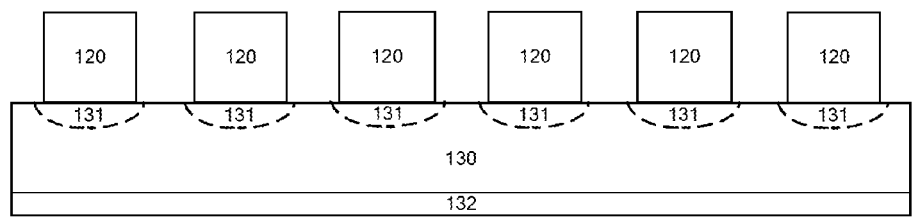
FIG. 13 is a cross-sectional view of a semiconductor electricity conversion structure with a semiconductor isolation layer according to an embodiment of the present disclosure.

FIG. 13 is a cross-sectional view of the semiconductor electricity conversion structure according to one embodiment of the present disclosure. As shown in FIG. 13, the semiconductor electricity conversion structure comprises a plurality of semiconductor electricity-to-light conversion unit 110 connected in series, a plurality of semiconductor light-to-electricity conversion units 120 connected in series and a substrate layer 130. The plurality of semiconductor electricity-to-light conversion unit 110 and the plurality of semiconductor light-to-electricity conversion units 120 are formed at a same side of the substrate layer 130. Each semiconductor electricity-to-light conversion unit 110 comprises an electricity-to-light conversion layer (not shown in FIG. 12), and each semiconductor light-to-electricity conversion unit 120 comprises a light-to-electricity conversion layer (not shown in FIG. 12). The substrate layer 130 is transparent to the working light emitted by the electricity-to-light conversion layer. The substrate layer 130 has a reflecting structure for changing the transmission direction of the working light to reflect the working light from the electricity-to-light conversion unit 110 to the light-to-electricity conversion unit 120, thus realizing the energy transmission and eventually realizing the voltage transformation. A material of the substrate layer 130 may be of a first doping type and any one of GaP, GaAs, InP, GaN, Si, Ge, GaSb, other semiconductor material transparent to the working light, and a combination thereof. A doped region 131 of a second doping type is formed between the isolation layer 130 and the plurality of semiconductor electricity-to-light conversion units 110 and between the isolation layer 130 and the plurality of semiconductor light-to-electricity conversion units 120 respectively, and one PN junction structure formed by the isolation layer 130 and the doped regions 131 is reverse biased. Similar with the embodiment above, in this embodiment, the PN junction structures between the plurality of semiconductor electricity-to-light conversion units 110 and the plurality of semiconductor light-to-electricity conversion units 120 are reverse biased to realize the electrical isolation, thus avoiding interaction between the input end and the output end.

In one embodiment, the semiconductor electricity-to-light conversion unit 110 comprises: a light emitting diode, a resonant cavity light emitting diode, a laser diode, a quantum dot light emitting device and an organic light emitting device. A material of the electricity-to-light conversion unit 110 comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

In one embodiment, the semiconductor light-to-electricity conversion unit 120 comprises: a semiconductor photovoltaic device, a quantum dot photovoltaic device and an organic material photovoltaic device. A material of the light-to-electricity conversion unit 120 comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

In one embodiment, a material of each electrode layer in a transmission path of the working light may be any one of conductive transparent materials GaAs, GaN, AlGaInP, AlGaInN, AlGaInAs, ITO (indium tin oxide), $SnO_2$, ZnO, grapheme and a combination thereof.

In a preferred embodiment, an electric filled between units may trap the working light. Specifically, in one embodiment, in the semiconductor electricity conversion structure 10 with the double-layer structure shown in FIG. 8, a transparent insulating dielectric or a reflecting insulating dielectric is filled between the semiconductor electricity-to-light conversion units 110, between the semiconductor light-to-electricity conversion units 120, or between the semiconductor electricity-to-light conversion unit 110 and the semiconductor light-to-electricity conversion unit 120, and a top of the transparent insulating dielectric is covered with a reflecting layer. In another embodiment, in the semiconductor electricity conversion structure 10 with the single-layer structure shown in FIG. 9, a transparent insulating dielectric or a reflecting insulating dielectric is filled between the semiconductor electricity-to-light conversion unit 110 and the semiconductor light-to-electricity conversion unit 120, and a top of the transparent insulating dielectric is covered with a reflecting layer.

In a preferred embodiment, the chip may further comprise a light trapping structure 150 for trapping a light within the semiconductor electricity conversion structure to reduce an energy loss caused by a light leakage. The light trapping structure 150 may be disposed in various ways, for example, for the semiconductor electricity conversion structure 10 with the double-layer structure, omnidirectional reflectors (ODR) or distributed Bragg reflectors (DBR) may be disposed on two non-adjacent faces of the semiconductor electricity-to-light conversion unit 110 and the semiconductor light-to-electricity conversion unit 120 to reflect the working light, thus preventing the working light from leaking out. Also for example, for the semiconductor electricity conversion structure 10 with the single-layer structure, the omnidirectional reflectors (ODR) or distributed Bragg reflectors (DBR) may be disposed on surfaces of the semiconductor electricity-to-light conversion unit 110 and the semiconductor light-to-electricity conversion unit 120 except surfaces adjacent to the isolation layer 130 to reflect the working light, thus preventing the working light from leaking out. A material of the Bragg reflector may be a rare earth oxide which has advantages of transparency to the working light, good insulation characteristic, and high voltage withstand.

Figure 14:
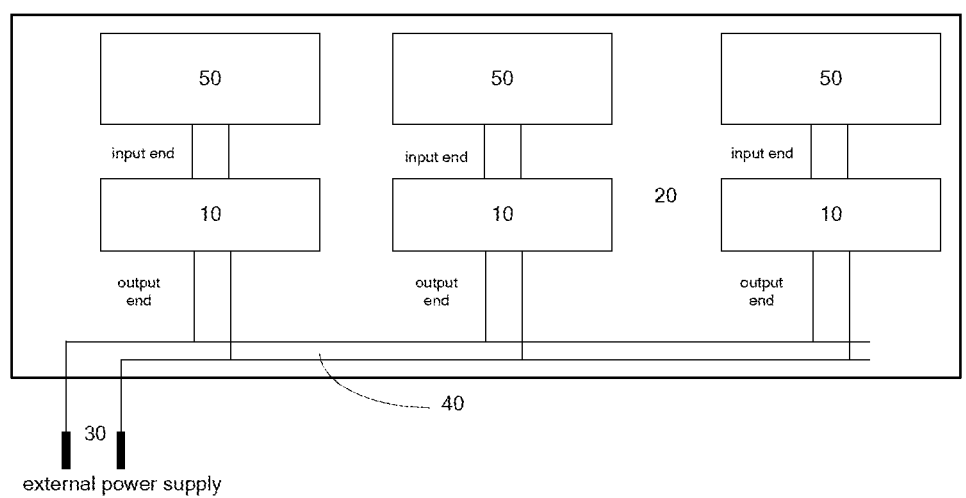
FIG. 14 is a schematic structural view of a chip according to an embodiment of the present disclosure.

In one embodiment as shown in FIG. 14, the chip may further comprise: one or more pins 30, an on-chip power supply distribution network 40 and a circuit function module 50. The one or more pins 30 are connected with an external power supply. The on-chip power supply distribution network 40 is connected with the one or more pins 30 and an input end of the at least one semiconductor electricity conversion structure 10 so as to allow the input end of the at least one semiconductor electricity conversion structure 10 to be connected to the external power supply. An output end of the at least one semiconductor electricity conversion structure 10 is connected with the circuit function module 50 to supply power to the circuit function module 50. The circuit function module 50 comprises various modules, such as a digital circuit, an analog circuit, a radio-frequency circuit, a flash memory, and a MEMS device, which are integrated in one chip but require different supply voltages. For instance, a plurality of different power supply voltages, which are ranging from 1.2V to 20V, are required for a flash memory chip, particularly, a power supply voltage of 10V-20V is required for a writing voltage.

In one embodiment, the chip may further comprise at least one adjusting and controlling module 60 connected with the at least one semiconductor electricity conversion structure 10 for performing a power adjusting control to the semiconductor electricity conversion structure 10. Specifically, the at least one adjusting and controlling module 60 may sample and control a current and voltage of the input end and output end of the at least one semiconductor electricity conversion structure 10 to realize a voltage adjustment, a voltage stabilization, an optimization of a power efficiency, an energy conservation turning off, etc.

In one embodiment, the chip is fully integrated, and a material of a substrate 20 of the chip comprises any one of Si, SiGe, GaAs, InP, SiC, $Al_2O_3$ and a flexible material. When the substrate 20 is the flexible material such as a plastic film, the semiconductor electricity-to-light conversion unit 110 may be an organic light emitting diode (OLED) or a quantum dot light emitting diode, and the semiconductor light-to-electricity conversion unit 120 may be an organic photovoltaic cell or a quantum dot photovoltaic cell.

In one embodiment, the chip may comprise a plurality of semiconductor electricity conversion structures 10 which share one semiconductor electricity-to-light conversion unit 110. For instance, a large area LED may be shared by the plurality of semiconductor electricity conversion structures 10 so as to enable a structure of the chip more simple and reliable.

Based on the embodiments of the present disclosure, further modifications may be implemented by those skilled in the art. For instance, by 3D integration technologies, such as through-silicon-via technique and system-in-package technique, the on-chip power distribution network, memory chips, CPUs, MCUs and MEMS sensors may be integrated on one chip.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A chip with a semiconductor electricity conversion structure, comprising:
   a substrate;
   at least one semiconductor electricity conversion structure formed on the substrate, the at least one semiconductor electricity conversion structure comprising:
      a voltage input and a voltage output;
      at least one semiconductor electricity-to-light conversion unit configured to convert an input electric energy received on the voltage input into a light energy, and
      at least one semiconductor light-to-electricity conversion unit positioned on the substrate to receive the light energy from the at least one semiconductor electricity-to-light conversion unit and configured to convert the received light energy back into an output electric energy on the voltage output,
      wherein an emitting spectrum of the semiconductor electricity-to-light conversion unit and an absorption spectrum of the semiconductor light-to-electricity conversion unit are matched with each other; and
   a load circuit connected to and powered by the voltage output.

2. The chip according to claim 1, wherein
   the at least one semiconductor electricity-to-light conversion unit forms an AC input module configured to convert an input AC electric energy into the light energy, with each semiconductor electricity-to-light conversion unit having an electricity-to-light conversion layer; and
   the at least one semiconductor light-to-electricity conversion unit forms an AC output module configured to convert the light energy into an output AC electric energy, with each semiconductor light-to-electricity conversion unit having a light-to-electricity conversion layer;
   wherein an emitting spectrum of each semiconductor electricity-to-light conversion unit and an absorption spectrum of each semiconductor light-to-electricity conversion unit are matched with each other.

3. The chip according to claim 2, wherein the AC input module comprises:
   a first input branch, working in a positive half cycle of an input AC current, the first input branch comprising $M_1$ semiconductor electricity-to-light conversion units connected in series, where $M_1$ is a positive integer; and
   a second input branch, connected with the first input branch in parallel and working in a negative half cycle of the input AC current, the second input branch comprising $M_2$ semiconductor electricity-to-light conversion units connected in series, where $M_2$ is a positive integer.

4. The chip according to claim 3, wherein the AC output module comprises:
   a first output branch, where a light transmission path is formed between the first output branch and the first input branch, the first output branch comprises $N_1$ semiconductor light-to-electricity conversion units connected in series, and $N_1$ is a positive integer; and a second output branch, connected with the first output branch in parallel, where polarities of the first output branch and the second output branch are opposite, a light transmission path is formed between the second output branch and the second input branch, the second output branch and comprises $N_2$ semiconductor light-to-electricity conversion units connected in series, where $N_2$ is a positive integer.

5. The chip according to claim 1, wherein
the at least one semiconductor electricity-to-light conversion unit forms an AC input module configured to convert an input AC electric energy into the light energy, with each semiconductor electricity-to-light conversion unit having an electricity-to-light conversion layer; and
the at least one semiconductor light-to-electricity conversion unit forms a DC output module configured to convert the light energy into an output DC electric energy, with each semiconductor light-to-electricity conversion unit having a light-to-electricity conversion layer;
wherein an emitting spectrum of each semiconductor electricity-to-light conversion unit and an absorption spectrum of each semiconductor light-to-electricity conversion unit are matched with each other.

6. The chip according to claim 5, wherein the AC input module comprises:
a first input branch, working in a positive half cycle of an input AC current, the first input branch comprising $M_1$ semiconductor electricity-to-light conversion units connected in series, where $M_1$ is a positive integer; and
a second input branch, connected with the first input branch in parallel and working in a negative half cycle of the input AC current, the second input branch comprising $M_2$ semiconductor electricity-to-light conversion units connected in series, where $M_2$ is a positive integer.

7. The chip according to claim 6, wherein the DC output module comprises:
a first output branch, where a light transmission path is formed between the first output branch and the first input branch, and the first output branch comprises $N_1$ semiconductor light-to-electricity conversion units connected in series, where $N_1$ is a positive integer; and
a second output branch, connected with the first output branch in parallel, where polarities of the first output branch and the second output branch are same, a light transmission path is formed between the second output branch and the second input branch, and the second output branch comprises $N_2$ semiconductor light-to-electricity conversion units connected in series, where $N_2$ is a positive integer.

8. The chip according to claim 1, wherein the at least one semiconductor electricity-to-light conversion unit forms a DC input module configured to convert an input DC electric energy into the light energy, with each semiconductor electricity-to-light conversion unit having an electricity-to-light conversion layer; and
the at least one semiconductor light-to-electricity conversion unit forms an AC output module configured to convert the light energy into an output AC electric energy, with each semiconductor light-to-electricity conversion unit having a light-to-electricity conversion layer;
wherein an emitting spectrum of each semiconductor electricity-to-light conversion unit and an absorption spectrum of each semiconductor light-to-electricity conversion unit are matched with each other.

9. The chip according to claim 8, wherein the DC input module comprises:
a first input branch, comprising $M_1$ semiconductor electricity-to-light conversion units connected in series and a first control switch, the first control switch switching the first input branch on in a positive half cycle of an output AC current, where $M_1$ is a positive integer; and
a second input branch, connected with the first input branch in parallel and comprising $M_2$ semiconductor electricity-to-light conversion units connected in series and a second control switch, the second control switch switching the second input branch on in a negative half cycle of the output AC current, where $M_2$ is a positive integer.

10. The chip according to claim 9, wherein the AC output module comprises:
a first output branch, where a light transmission path is formed between the first output branch and the first input branch, and the first output branch comprises $N_1$ semiconductor light-to-electricity conversion units connected in series, where $N_1$ is a positive integer; and
a second output branch, connected with the first output branch in parallel, where polarities of the first output branch and the second output branch are opposite, a light transmission path is formed between the second output branch and the second input branch, and the second output branch comprises $N_2$ semiconductor light-to-electricity conversion units connected in series, where $N_2$ is a positive integer.

11. The chip according to claim 1, wherein the at least one semiconductor electricity-to-light conversion unit forms a DC input module configured to convert an input DC electric energy into the light energy, with each semiconductor electricity-to-light conversion unit having an electricity-to-light conversion layer; and
the at least one semiconductor light-to-electricity conversion unit forms a DC output module configured to convert the light energy into an output DC electric energy, with each semiconductor light-to-electricity conversion unit having a light-to-electricity conversion layer,
wherein an emitting spectrum of each semiconductor electricity-to-light conversion unit and an absorption spectrum of each semiconductor light-to-electricity conversion unit are matched with each other.

12. The chip according to claim 1, further comprising:
an isolation layer,
wherein the at least one semiconductor electricity-to-light conversion unit is located at one side of the isolation layer, the at least one semiconductor light-to-electricity conversion unit is located at the other side of the isolation layer, each semiconductor electricity-to-light conversion unit comprises an electricity-to-light conversion layer, and the isolation layer is transparent to a working light emitted by the electricity-to-light conversion layer.

13. The chip according to claim 1, further comprising:
an isolation layer having a reflecting structure,
wherein the at least one semiconductor electricity-to-light conversion unit and the at least one semiconductor light-to-electricity conversion unit are located at a same side of the isolation layer and arranged alternately, each semiconductor electricity-to-light conversion unit comprises an electricity-to-light conversion layer, each semiconductor light-to-electricity conversion unit comprises a light-to-electricity conversion layer, the isolation layer is transparent to a working light emitted by the electricity-to-light conversion layer, and the reflecting structure is used for reflecting the working light from the electricity-to-light conversion layer onto the light-to-electricity conversion layer.

14. The chip according to claim 1, further comprising:
a light trap configured to trap a light within the chip to prevent an energy loss caused by a light leakage.

15. The chip according to claim 1, wherein a refractive index of a material of each layer in a light transmission path is matched with each other.

16. The chip according to claim 12, wherein at least one of the semiconductor electricity-to-light conversion unit, the isolation layer and the semiconductor light-to-electricity conversion unit has a roughened surface, a patterned surface or a photonic crystal structure.

17. The chip according to claim 12, wherein a material of the isolation layer is an insulation material, comprising any one of $Al_2O_3$, AlN, $SiO_2$, MgO, $Si_3N_4$, BN, $ZrO_2$, $TiO_2$, diamond, $LiAlO_2$, $LiGaO_2$, semi-insulating GaAs, semi-insulating SiC, semi-insulating GaP, GaN and a combination thereof; or any one of a rare earth oxide and a combination of different rare earth oxides.

18. The chip according to claim 12, wherein a material of the isolation layer is a semiconductor material, comprising any one of GaP, GaAs, InP, GaN, Si, Ge, GaSb, other semiconductor material transparent to the working light, and a combination thereof.

19. The chip according to claim 12, wherein an isolation between the semiconductor electricity-to-light conversion unit and the isolation layer and/or an isolation between the semiconductor light-to-electricity conversion unit and the isolation layer is realized by a reverse biased PN junction structure.

20. The chip according to claim 1, wherein the semiconductor electricity-to-light conversion unit comprises: a light emitting diode, a resonant cavity light emitting diode, a laser diode, a quantum dot light emitting device and an organic light emitting device.

21. The chip according to claim 1, wherein a material of the electricity-to-light conversion layer comprises any one of AlGaInP, GaN, InGaN, InGaN, AlGaInN, ZnO, AlGaInAs, GaAs, InGaAs, InGaAsP, AlGaAs, AlGaInSb, InGaAsNSb, other groups III-V and II-VI semiconductor materials and a combination thereof, organic light emitting materials and quantum dot light emitting materials.

22. The chip according to claim 1, wherein the semiconductor light-to-electricity conversion unit comprises: a semiconductor photovoltaic device, a quantum dot photovoltaic device and an organic material photovoltaic device.

23. The chip according to claim 1, wherein a material of the light-to-electricity conversion layer comprises any one of AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials and a combination thereof, organic photovoltaic materials and quantum dot photovoltaic materials.

24. The chip according to claim 1, wherein a material of an electrode layer in the light transmission path is a transparent conductive material, comprising any one of GaAs, GaN, AlGaInP, AlGaInN, AlGaInAs, ITO, $SnO_2$, ZnO, grapheme and a combination thereof.

25. The chip according to claim 1, wherein
a transparent insulating dielectric is filled between the semiconductor electricity-to-light conversion units, between the semiconductor light-to-electricity conversion units, or between the semiconductor electricity-to-light conversion unit and the semiconductor light-to-electricity conversion unit, and a top of the transparent insulating dielectric is covered with a reflecting layer; or
a reflecting insulating dielectric is filled between the semiconductor electricity-to-light conversion units, between the semiconductor light-to-electricity conversion units, or between the semiconductor electricity-to-light conversion unit and the semiconductor light-to-electricity conversion unit.

26. The chip according to claim 1, further comprising:
one or more pins, connected with an external power supply;
an on-chip power supply distribution network, connected with the one or more pins and the at least one semiconductor electricity conversion structure; and
a circuit function module, comprising the circuit load, connected with the at least one semiconductor electricity conversion structure,
wherein the voltage input of the semiconductor electricity conversion structure is connected with the on-chip power supply distribution network, the voltage output of the semiconductor electricity conversion structure is connected with the circuit function module.

27. The chip according to claim 1, further comprising:
at least one adjusting and controlling module, connected with the at least one semiconductor electricity conversion structure configured to perform a power adjusting control to the semiconductor electricity conversion structure according to an output of the semiconductor electricity conversion structure.

28. The chip according to claim 1, wherein the chip is fully integrated, and a material of a substrate of the chip comprises any one of Si, SiGe, GaAs, InP, SiC, $Al_2O_3$ and a flexible material.

29. The chip according to claim 13, wherein at least one of the semiconductor electricity-to-light conversion unit, the isolation layer and the semiconductor light-to-electricity conversion unit has a roughened surface, a patterned surface or a photonic crystal structure.

30. The chip according to claim 13, wherein a material of the isolation layer is an insulation material, comprising any one of $Al_2O_3$, AlN, $SiO_2$, MgO, $Si_3N_4$, BN, $ZrO_2$, $TiO_2$, diamond, $LiAlO_2$, $LiGaO_2$, semi-insulating GaAs, semi-insulating SiC, semi-insulating GaP, GaN and a combination thereof; or any one of a rare earth oxide and a combination of different rare earth oxides.

31. The chip according to claim 13, wherein a material of the isolation layer is a semiconductor material, comprising any one of GaP, GaAs, InP, GaN, Si, Ge, GaSb, other semiconductor material transparent to the working light, and a combination thereof.

32. The chip according to claim 13, wherein an isolation between the semiconductor electricity-to-light conversion unit and the isolation layer and/or an isolation between the semiconductor light-to-electricity conversion unit and the isolation layer is realized by a reverse biased PN junction structure.

* * * * *